(12) United States Patent
Takahashi et al.

(10) Patent No.: US 7,444,822 B2
(45) Date of Patent: Nov. 4, 2008

(54) HEAT EXCHANGER AND MANUFACTURING METHOD THEREOF

(75) Inventors: Norio Takahashi, Hiratsuka (JP); Wataru Kiyosawa, Hiratsuka (JP)

(73) Assignee: Komatsu Electronics Inc., Kanagawa (JP)

( * ) Notice: Subject to any disclaimer, the term of this patent is extended or adjusted under 35 U.S.C. 154(b) by 465 days.

(21) Appl. No.: 11/192,012

(22) Filed: Jul. 29, 2005

(65) Prior Publication Data
US 2006/0191271 A1  Aug. 31, 2006

(30) Foreign Application Priority Data
Feb. 28, 2005  (JP) .............................. 2005-053629

(51) Int. Cl.
*F25B 21/02* (2006.01)
(52) U.S. Cl. ............................... 62/3.7; 62/3.2; 136/204
(58) Field of Classification Search .................... 62/3.2, 62/3.3, 3.6, 3.7, 37; 136/204
See application file for complete search history.

(56) References Cited
U.S. PATENT DOCUMENTS 5,168,339 A * 12/1992 Yokotani et al. ............... 257/64
5,409,547 A * 4/1995 Watanabe et al. ........... 136/204
5,715,684 A * 2/1998 Watanabe et al. ............. 62/3.2

FOREIGN PATENT DOCUMENTS

JP  2001-183025  7/2001
KR  10-0343386  7/2002

\* cited by examiner

*Primary Examiner*—Melvin Jones
(74) *Attorney, Agent, or Firm*—Wenderoth, Lind & Ponack, L.L.P.

(57) ABSTRACT

Resins (5, 6) are interposed as insulating layers between heat radiation side and heat absorption side heat exchange bodies (2, 3) and heat radiation side and heat absorption side electrodes (41, 42) of a thermoelectric conversion element module (4). The resin (5) is fusion bonded to the heat radiation side heat exchange body (2), and the resin (6) is fusion bonded to the heat radiation side heat exchange body (3). The material of the resins (5, 6) is, for example, a thermosetting plastic. The thermosetting plastic becomes soft when heated and then cures. At the time of fusion bonding of the resins (5, 6) to the heat exchange bodies (2, 3), the heat exchange bodies (2, 3) and the resins (5, 6) are heated and pressed. Then, the resins (5, 6) become soft and enter the cavities and flaws formed in the surfaces of the heat exchange bodies (2, 3). The resins (5, 6) having entered the cavities and flaws cure to fill the cavities in the surfaces of the heat exchange bodies (2, 3).

4 Claims, 6 Drawing Sheets

HEAT EXCHANGER AND MANUFACTURING METHOD THEREOF

BACKGROUND OF THE INVENTION

1. Field of the Invention

The present invention relates to a heat exchanger with a thermoelectric conversion element module interposed between heat exchange bodies on a heat radiation side and heat exchange bodies on a heat absorption side and a manufacturing method thereof, and more particularly to reduction of thermal resistance in the heat exchanger and to improvement of the yield at the time of manufacturing the heat exchanger.

2. Description of the Related Art

In a semiconductor manufacturing apparatus (e.g., an etcher apparatus), a cooling medium, a chemical solution or the like is used. The cooling medium or the chemical solution requires its temperature control, so that a heat exchanger is used as an apparatus for temperature controlling. FIG. 5 is a diagram showing a structure of a basic heat exchanger.

A heat exchanger 20 includes heat radiation side and heat absorption side heat exchange bodies 2, 3 and a thermoelectric conversion element module 4 interposed between the heat radiation side heat exchange body 2 and the heat absorption side heat exchange body 3. The thermoelectric conversion element module 4 is comprised of heat radiation side electrodes 41, heat absorption side electrodes 42 and p-type and n-type thermoelectric conversion elements 43, 44 interposed between the electrodes 41, 42. The electrodes 41, 42 and the p-type and n-type thermoelectric conversion elements 43, 44 are connected serially in order of the heat radiation side electrodes 41, the n-type thermoelectric conversion elements 44, the heat absorption side electrodes 42, the p-type thermoelectric conversion elements 43, the heat radiation side electrodes 41, the n-type thermoelectric conversion elements 44, . . . .

The heat radiation side and heat absorption side heat exchange bodies 2, 3 and the thermoelectric conversion element module 4 must be electrically insulated from each other. Therefore, thin insulating layers 21, 22 of alumite or the like are respectively interposed between the heat radiation side heat exchange body 2 and the heat radiation side electrodes 41 and between the heat absorption side heat exchange body 3 and the heat absorption side electrodes 42. Adhesion between the heat radiation side electrodes 41 and the insulating layer 21 and between the heat absorption side electrodes 42 and the insulating layer 22 is made with grease 23, 24 or an adhesive between them.

Generally, the grease or the adhesive has thermal resistance which is relatively greater than that of a metal. Therefore, when the grease or the like is used for the heat exchanger, thermal conductivity drops, and heat exchange efficiency lowers. Especially, great heat quantity transfers on the heat radiation side of the heat exchanger. Therefore, when grease or the like is disposed on the heat radiation side, heat exchange efficiency lowers considerably. Compensation for the lowered quantity of the efficiency requires an increase in current, causing an increase in power consumption. Accordingly, there is developed a technology of lowering the thermal resistance of the heat exchanger in these years.

Japanese Patent No. 3510831 discloses a technology that adheres a heat exchange body and heat radiation side electrodes of a thermoelectric conversion element module without grease interposed between them. FIG. 6 is a diagram showing a structure of the heat exchanger disclosed in Japanese Patent No. 3510831.

According to the technology described in Japanese Patent No. 3510831, the alumina insulating coat 25 is formed on the surface of the heat radiation side heat exchange body 2 by spraying, and the metal coat 27 of copper, a copper alloy, nickel or the like is additionally formed on the surface of the insulating coat 25 by plasma spraying or metalizing. And, the metal coat 27 and the heat radiation side electrodes 41 of the thermoelectric conversion element module 4 are fixed by soldering. By configuring in this way, thermal resistance is reduced because no grease is interposed between the heat radiation side heat exchange body 2 and the heat radiation side electrodes 41.

According to the technology described in Japanese Patent No. 3510831, the alumina insulating coat 26 is also formed on the surface of the heat absorption side heat exchange body 3 by spraying. And, the insulating coat 26 and the heat absorption side electrodes 42 of the thermoelectric conversion element module 4 are adhered to each other with the grease 9 between them. The grease 9 is interposed to make the heat absorption side heat exchange body 3 slidable against the thermoelectric conversion element module 4. If the heat absorption side heat exchange body 3 is fixed to the thermoelectric conversion element module 4, the thermoelectric conversion element module 4 might be damaged when the heat absorption side heat exchange body 3 undergoes thermal expansion or contraction. Interposition of the grease between the thermoelectric conversion element module 4 and the heat absorption side heat exchange body 3 prevents the damage.

The heat radiation side and heat absorption side heat exchange bodies are made of a metal such as a cast or extrusion material. When cast or extruded, the heat radiation side and heat absorption side heat exchange bodies include cavities. The cavities in the surfaces of the heat radiation side and heat absorption side heat exchange bodies become small holes. And, the surfaces of the heat radiation side and heat absorption side heat exchange bodies might also have fine flaws and the like other than the cavities.

The cavities, flaws and the like in the surfaces of the heat radiation side and heat absorption side heat exchange bodies cannot be filled by alumina spraying disclosed in Japanese Patent No. 3510831. Therefore, insulation cannot be secured between the heat exchange bodies and the electrodes of the thermoelectric conversion element module because an insulating coat is not formed on any part of the surface having the cavities, flaws and the like. Such heat exchange bodies are judged defective and discarded in an insulation test stage. In other words, the technology of Japanese Patent 3510831 has a problem that the yield in the heat exchanger manufacturing becomes low.

The present invention has been made in view of the above circumstances and secures the insulation between the heat exchange bodies and the thermoelectric conversion element module and improves the yield when manufacturing the heat exchanger.

SUMMARY THE INVENTION

A first aspect of the present invention provides a heat exchanger, comprising:

heat radiation side heat exchange bodies (2) and heat absorption side heat exchange bodies (3);

thermoelectric conversion element modules (4) which are respectively configured of plural heat radiation side electrodes (41) and heat absorption side electrodes (42) and plural thermoelectric conversion elements (43, 44), and interposed between the heat radiation side heat exchange bodies (2) and the heat absorption side heat exchange bodies (3);

a heat radiation side insulating layer (5) which is interposed between the heat radiation side electrodes (41) of the thermoelectric conversion element module (4) and the heat radiation side heat exchange body (2); and a heat absorption side insulating layer (6) which is interposed between the heat absorption side electrodes (42) of the thermoelectric conversion element module (4) and the heat absorption side heat exchange body (3), wherein:

at least one of the heat radiation side insulating layer (5) and the heat absorption side insulating layer (6) is a resin (5, 6) which is fusion bonded to the adjacent heat exchange body (2, 3).

A second aspect of the present invention provides the heat exchanger according to the first aspect of the invention, wherein the resin (5, 6) fills cavities and flaws in the surface of the adjacent heat exchange body (2, 3).

A third aspect of the present invention provides the heat exchanger according to the first aspect of the invention, wherein a metal foil (7) is interposed between the electrodes (41, 42) of the thermoelectric conversion element module (4) and the resins (5, 6).

A fourth aspect of the present invention provides the heat exchanger according to the first aspect of the invention, wherein grease (9) is interposed between the heat absorption side electrodes (42) of the thermoelectric conversion element module (4) and the heat absorption side insulating layer (6).

The first through fourth aspects of the present invention will be described with reference to FIG. 2.

A heat exchanger 1 is generally comprised of the heat radiation side heat exchange body 2, the heat absorption side heat exchange body 3 and the thermoelectric conversion element module 4 which is interposed between the heat radiation side heat exchange body 2 and the heat absorption side heat exchange body 3. The thermoelectric conversion element module 4 is configured of the plural heat radiation side and heat absorption side electrodes 41, 42 and the plural thermoelectric conversion elements 43, 44. When power is applied to the thermoelectric conversion element module 4, a temperature difference is produced between the heat radiation side electrodes 41 and the heat absorption side electrodes 42, and heat exchange is performed between the heat radiation side heat exchange body 2 and the heat absorption side heat exchange body 3.

The resin 5 is interposed as an insulating layer between the heat radiation side heat exchange body 2 and the heat radiation side electrodes 41 of the thermoelectric conversion element module 4. The resin 5 is fusion bonded to the heat radiation side heat exchange body 2. And, the resin 6 is interposed as an insulating layer between the heat absorption side heat exchange body 3 and the heat absorption side electrodes 42 of the thermoelectric conversion element module 4. The resin 6 is fusion bonded to the heat radiation side heat exchange body 3. The material of the resins 5, 6 is, for example, thermosetting plastic. The thermosetting plastic becomes soft when heated and then cures. To fusion bond the resins 5, 6 to the heat radiation side and heat absorption side heat exchange bodies 2, 3, the heat radiation side and heat absorption side heat exchange bodies 2, 3 and the resins 5, 6 are heated and pressed. The resins 5, 6 become soft and enter the cavities and flaws in the surfaces of the heat radiation side and heat absorption side heat exchange bodies 2, 3. The resins 5, 6 having entered the cavities and flaws cure and fill the cavities and flaws in the surfaces of the heat radiation side and heat absorption side heat exchange bodies 2, 3.

The metal foil 7 is interposed between the resin 5 and the heat radiation side electrodes 41 of the thermoelectric conversion element module 4. The resin 5 is also fusion bonded to the metal foil 7. And, the metal foil 7 and the heat radiation side electrodes 41 are fixed to each other by soldering. Meanwhile, the grease 9 is interposed between the resin 6 and the heat absorption side electrodes 42 of the thermoelectric conversion element module 4. The resin 6 is adhered in a slidable state to the heat absorption side electrodes 42 by means of the grease 9. The heat absorption side electrodes 42 and the resin 6 may be fixed by means of a metal foil and solder instead of the grease 9.

A fifth aspect of the present invention provides a manufacturing method of a heat exchanger having a thermoelectric conversion element module between two heat exchange bodies, wherein:

the heat exchange body and a resin sheet are contacted, the heat exchange body and the resin sheet are heated and pressed such that the melted resin sheet enters cavities and flaws in the surface of the heat exchange body to form an insulating layer for insulating the heat exchange body and thermoelectric conversion element module.

The fifth aspect of the present invention is a method of manufacturing the heat exchanger according to the first aspect of the present invention.

According to the present invention, the insulating layer (resin) is disposed between the heat exchange body and the electrodes of the thermoelectric conversion element module. The resin becomes soft when heated and then cures to fill the cavities and flaws in the surface of the heat exchange body. Therefore, the insulation between the electrodes of the thermoelectric conversion element module and the heat exchange body can be secured regardless of the presence or not of the cavities and flaws in the surface of the heat exchange body. Thus, the yield when the heat exchanger is produced can be improved.

According to the fourth aspect of the present invention, the heat absorption side heat exchange body is adhered in a slidable state to the thermoelectric conversion element module by use of the grease. Therefore, even if the heat absorption side heat exchange body undergoes great expansion or contraction, a problem such as a breakage of the thermoelectric conversion element module or the separation of the thermoelectric conversion element module from the heat absorption side heat exchange body can be prevented.

DETAILED DESCRIPTION OF THE INVENTION

Embodiments of the present invention will be described with reference to the accompanying figures.

It is assumed in the following description that the side to be controlled to a prescribed temperature by the thermoelectric conversion element module is referred to as the heat absorption side and the side which radiates heat generated by the heat exchange of the thermoelectric conversion element module is referred to as the heat radiation side regardless of whether cooling or heating is performed. A heat exchanger for controlling the temperature of a chemical solution used for the semiconductor manufacturing apparatus (e.g., etcher apparatus) is assumed in the following embodiments.

EMBODIMENT 1

[Structure of Heat Exchanger]

Figure 1:
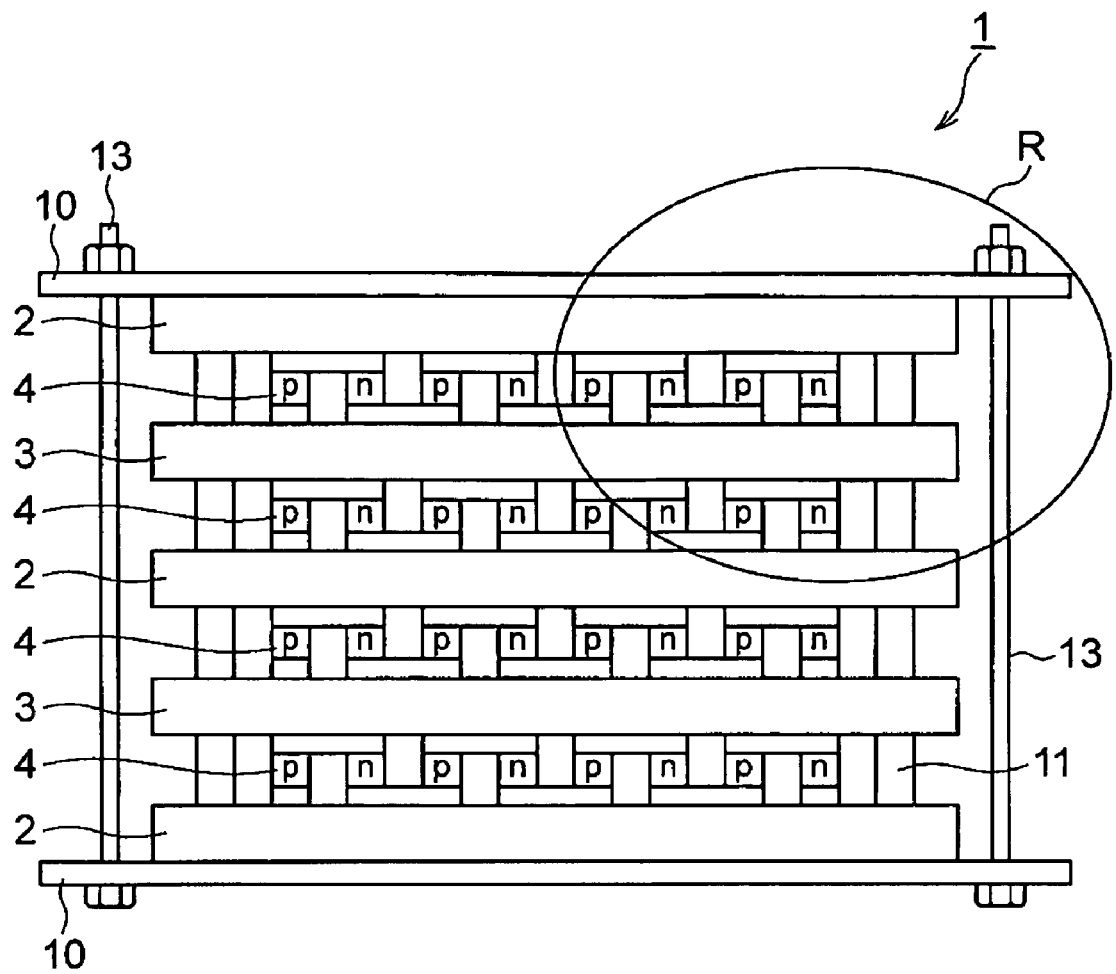
FIG. 1 is a diagram showing a structure of a heat exchanger 1.
Figure 2:
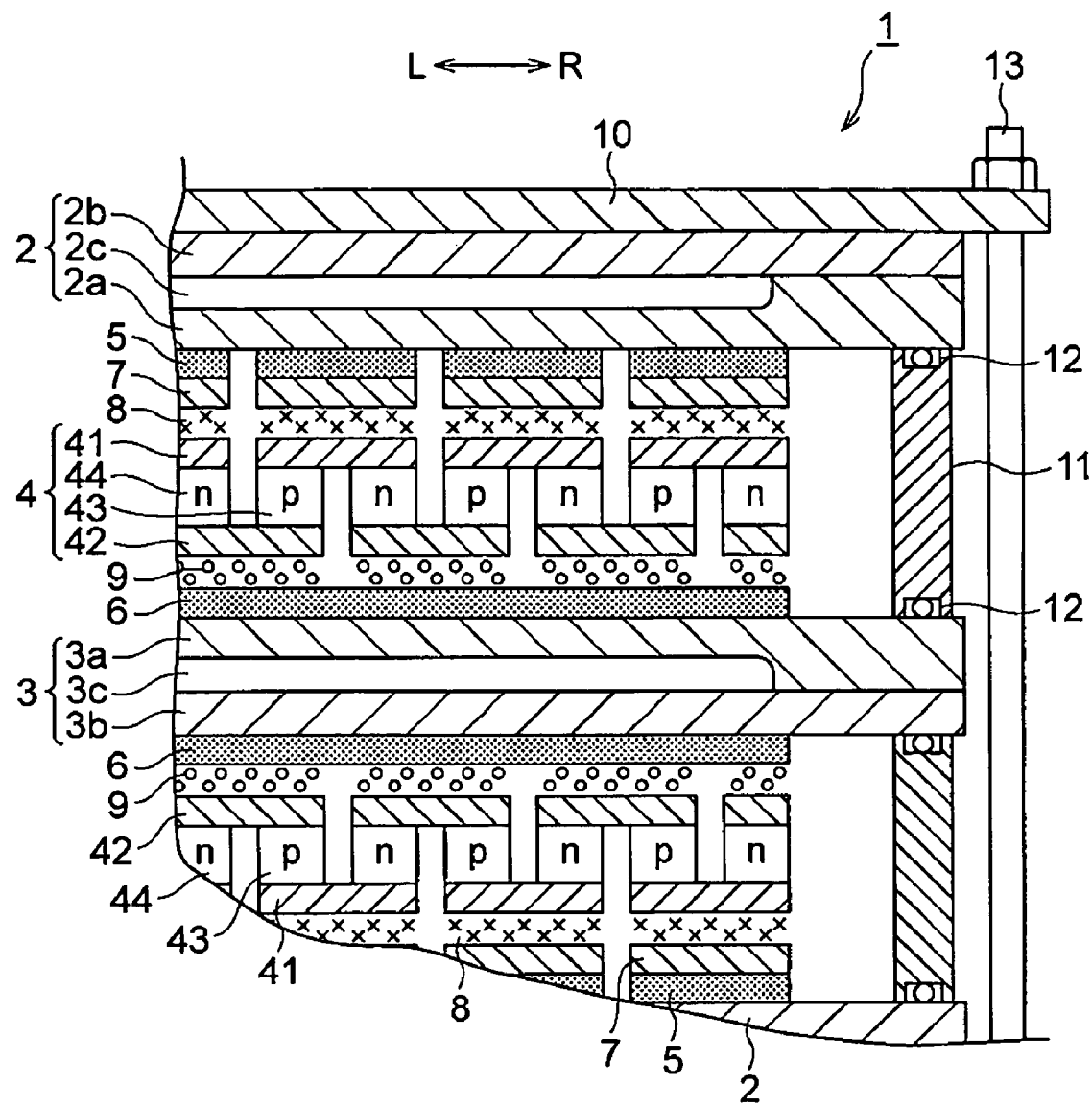
FIG. 2 is a diagram showing a structure of the heat exchanger 1 according to a first embodiment.

FIG. 1 is a diagram showing a structure of the heat exchanger 1. FIG. 2 is a diagram showing a structure of the heat exchanger 1 according to the first embodiment, showing in detail an area indicated by R in FIG. 1.

The heat exchanger 1 has heat radiation side heat exchange bodies 2, through which cooling water flows, and heat absorption side heat exchange bodies 3, through which a chemical solution (Fluorinert, Galden, pure water, ethylene glycol or the like) flows, disposed alternately and hierarchically. These heat exchange bodies 2, 3 are comprised of blocks 2a, 3a and plates 2b, 3b. A groove is formed in the surfaces of the blocks 2a, 3a. When the plate 2b is put on the block 2a, the groove in the block 2a is covered to form a cooling water flow passage 2c. Similarly, when the plate 3b is put on the block 3a, the groove in the block 3a is covered to form a chemical solution flow passage 3c. The heat radiation side heat exchange body 2 and the heat absorption side heat exchange body 3 are made of a metal such as aluminum (A6063, AC4C or the like), copper, a copper alloy, stainless steel or the like having high thermal conductivity.

A thermoelectric conversion element module 4 is interposed between the heat radiation side heat exchange body 2 and the heat absorption side heat exchange body 3. The thermoelectric conversion element module 4 is formed by arranging heat radiation side electrodes 41, heat absorption side electrodes 42 and p-type and n-type thermoelectric conversion elements 43, 44 in plural into a module. The heat radiation side electrodes 41 and the heat absorption side electrodes 42 are plates made of a metal having high thermal conductivity and less resistance, e.g., copper. The p-type thermoelectric conversion elements 43 and the n-type thermoelectric conversion elements 44 are connected to both ends of the surfaces of the heat radiation side electrodes 41 and the heat absorption side electrodes 42 by soldering. The heat radiation side electrodes 41 and the heat absorption side electrodes 42 as well as the p-type thermoelectric conversion elements 43 and the n-type thermoelectric conversion elements 44 are connected serially. The heat radiation side electrodes 41 are disposed on the heat radiation side, and the heat absorption side electrodes 42 are disposed on the heat absorption side.

When an electric current flows the thermoelectric conversion element module 4 in the direction indicated by arrow L, the heat radiation side electrodes 41 are heated, while the heat absorption side electrodes 42 are cooled. When an electric current flows the thermoelectric conversion element module 4 in the direction indicated by R, the heat radiation side electrodes 41 are cooled, while the heat absorption side electrodes 42 are heated. Thus, when a current is flown through the thermoelectric conversion element module 4, a temperature difference occurs between the heat radiation side electrodes 41 and the heat absorption side electrodes 42, and heat exchange is executed between the heat radiation side heat exchange body 2 and the heat absorption side heat exchange body 3.

Where heat is transferred from the heat absorption side heat exchange body 3 to the heat radiation side heat exchange body 2 by the thermoelectric conversion element module 4, heat quantity transferred from the heat absorption side heat exchange body 3 to the thermoelectric conversion element module 4 is Qc, heat quantity transferred from the thermoelectric conversion element module 4 to the heat radiation side heat exchange body 2 is Qh, power consumed by the thermoelectric conversion element module 4 is W, and the relation is formularized by the equation, $Qh=Qc+W$. It is seen from the equation that $Qh>Qc$. Therefore, the thermal resistance between the thermoelectric conversion element module 4 and the heat radiation side heat exchange body 2 is desirably reduced as small as possible to improve heat exchange efficiency. Accordingly, it is not desirable to have grease or the like having large thermal resistance between the thermoelectric conversion element module 4 and the heat radiation side heat exchange body 2.

Resin 5, metal foil 7 and solder 8 are interposed between the heat radiation side heat exchange body 2 and the heat radiation side electrodes 41 of the thermoelectric conversion element module 4. The resin 5, the metal foil 7 and the solder 8 are laminated in this order from the side of the heat radiation side heat exchange body 2 to the side of the heat radiation side electrodes 41.

The resin 5 is fusion bonded to the surface of the heat radiation side heat exchange body 2. The material of the resin 5 is thermosetting plastic, and more specifically formaldehyde resin (phenol resin, amino resin or the like) or crosslinking resin (unsaturated polyester resin, diallyl phthalate resin, alkyd resin, epoxy resin, urethane resin, silicon or the like). It is general that the thermosetting plastic becomes soft when heated and becomes fabricable, but if heated continuously, causes a chemical reaction to cure. And, when it cures once, it does not become soft again. This embodiment is based on the above characteristics of the thermosetting plastic. The resin 5 becomes soft at the time of fusion bonding to enter the cavities and flaws in the surface of the heat radiation side heat exchange body 2 and cures. It is adequate when the layer of the resin 5 has a thickness of, for example, about 0.1 mm such that the heat radiation side heat exchange body 2 and the heat radiation side electrodes 41 are insulated from each other. It is not essential to have the resin 5 on the whole surface of the heat radiation side heat exchange body 2. As shown in FIG. 2, it is sufficient when the resin 5 is partly formed at positions corresponding to at least those of the heat radiation side electrodes 41. A fusion bonding method of the resin 5 will be described later.

The resin 5 is also fusion bonded to the metal foil 7. The metal foil 7 may be a metal having high thermal conductivity and low electric resistance, such as copper, a copper alloy, nickel, platinum or the like. It is not essential to have the metal foil 7 on the whole surface of the resin 5, but it is adequate when partly formed at positions corresponding to at least those of the heat radiation side electrodes 41 as shown in FIG. 2. Where the metal foil 7 is partly disposed, the metal foil fusion bonded to the resin 5 may be etched in conformity with an arranged pattern of the heat radiation side electrodes 41. The heat radiation side electrodes 41 and the metal foil 7 are soldered. Thus, a layer of the solder 8 is formed between the heat radiation side electrodes 41 and the metal foil 7. The heat radiation side electrodes 41 are fixed to the resin 5 by the metal foil 7 and the solder 8.

The resin 6 and the grease 9 are interposed between the heat absorption side heat exchange body 3 and the heat absorption side electrodes 42, and the heat absorption side heat exchange body 3, the resin 6, the grease 9 and the heat absorption side electrodes 42 are laminated in this order.

Material and a fusion bonding method of the resin 6 are the same as those of the resin 5. The grease 9 is interposed between the heat absorption side electrodes 42 and the resin 6. Generally, the grease has low thermal conductivity in comparison with other members. Accordingly, it is desirable to mix the grease 9 with ceramic, metal powder, fiber or the like because the thermal conductivity of the grease 9 itself becomes high. The grease 9 having low thermal conductivity is sparingly disposed on the heat absorption side because of the following reasons.

The heat radiation side heat exchange body 2 has a temperature which is variable in a narrow range of about several degrees C to 30 degrees C. which are temperatures of cooling water flowing through a cooling water flow passage 2c. Meanwhile, the temperature of the heat absorption side heat exchange body 3 is variable in a wide range of –20 degrees C. to +80 degrees C. Therefore, the size of the heat radiation side heat exchange body 2 does not change largely, but the heat absorption side heat exchange body 3 undergoes great expansion or contraction. Where the thermoelectric conversion element module 4 is fixed to both the heat radiation side heat exchange body 2 and the heat absorption side heat exchange body 3, the thermoelectric conversion element module 4 is deformed to break or separate from the heat absorption side heat exchange body 3 depending on the degree of expansion or contraction of the heat absorption side heat exchange body 3. To avoid the problem, the grease 9 is interposed between the heat absorption side heat exchange body 3 and the thermoelectric conversion element module 4 so as to adhere the resin 6 in a slidable state to the heat absorption side electrode 42 of the thermoelectric conversion element module 4.

But, if a range of a temperature change of the heat absorption side heat exchange body 3 is not so great, it is not necessary to employ the grease 9. Similar to the structure of the heat radiation side, the heat absorption side electrodes 42 may be fixed to the resin 6 by use of a metal foil and solder. If no grease is interposed between the heat absorption side electrodes 42 and the heat absorption side heat exchange body 3, the thermal resistance becomes small, and the heat exchange efficiency is improved furthermore.

A frame 11 having an O-ring 12 is disposed between the heat radiation side heat exchange body 2 and the heat absorption side heat exchange body 3 and around the entire periphery of the thermoelectric conversion element module 4. The frame 11 seals the thermoelectric conversion element module 4 from the outside to prevent short-circuit of the thermoelectric conversion element module 4 due to dewing.

The heat radiation side heat exchange bodies 2 and the heat absorption side heat exchange bodies 3 are disposed alternately and hierarchically, and the heat radiation side heat exchange bodies 2, 2 are disposed on both sides of the laminated body (top and bottom in FIG. 1). In addition, fastening plates 10, 10 are disposed on the outside surfaces of the heat radiation side heat exchange bodies 2, 2. The fastening plates 10, 10 are fixed mutually by fastening bolts 13 disposed at four corners. When the fastening bolts 13 are fastened, adhesion of the heat radiation side heat exchange bodies 2, the thermoelectric conversion element modules 4 and the heat absorption side heat exchange bodies 3 is improved, and thermal conductivity becomes high. Accordingly, heat exchange can be conducted efficiently.

[Fusion Bonding Method of Resin]

A fusion bonding method of the heat exchange body and the resin will be described. Here, a method of fusion bonding the heat radiation side heat exchange body 2, the resin 5 and the metal foil 7 will be described.

Figure 3:
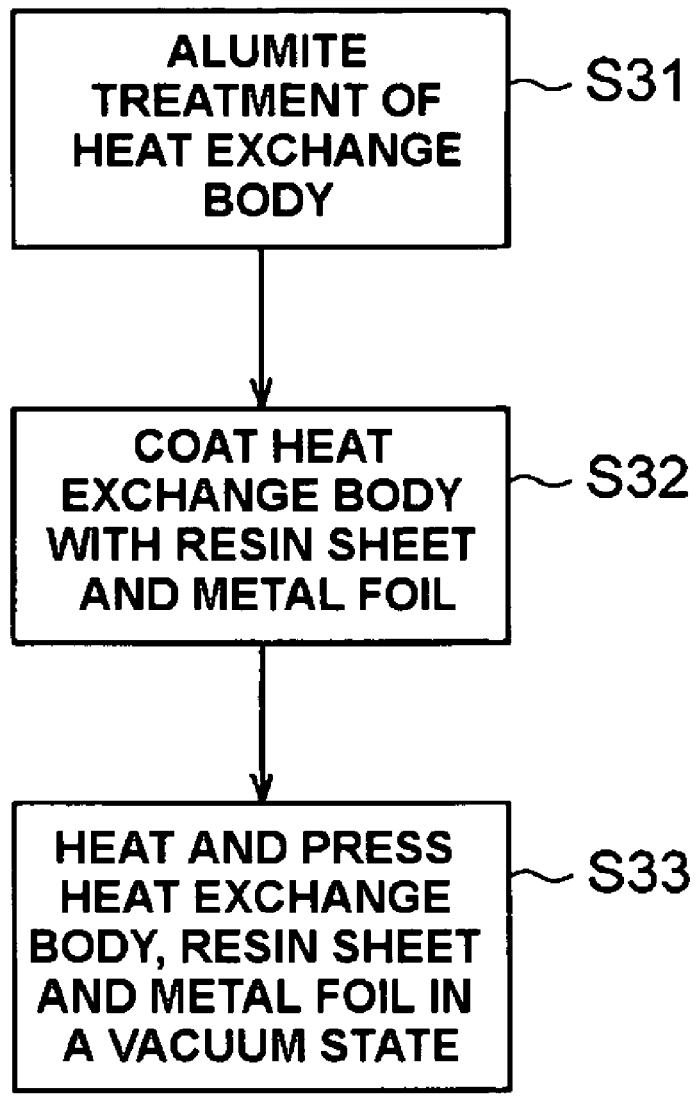
FIG. 3 is a diagram showing a fusion bonding step of a resin.

FIG. 3 is a diagram showing a fusion bonding step of the resin.

First, the surface of the heat radiation side heat exchange body 2 undergoes alumite treatment to enhance the anchor effect (step S31). After the alumite treatment, the resin 5 in a sheet form is placed on the heat radiation side heat exchange body 2, and the metal foil 7 is placed on the resin 5 (step S32). In this state, the resin 5 is merely contacted between the heat radiation side heat exchange body 2 and the metal foil 7. This unit of the heat radiation side heat exchange body 2, the resin 5 and the metal foil 7 is put in an oven, and the temperature in the oven is increased in a vacuum state. Within the oven, a force is applied to the heat radiation side heat exchange body 2 and the metal foil 7 in the direction of the resin 5. Thus, the heat radiation side heat exchange body 2, the resin 5 and the metal foil 7 are heated and pressed (step S33). If the temperature and pressure are appropriate, the resin 5 becomes soft and enters cavities and flaws in the surface of the heat radiation side heat exchange body 2. The resin 5 enters the cavities and flaws and cures to fill them in the surface of the heat exchange body 2. To conform the metal foil 7 to the arranged pattern of the heat radiation side electrodes 41 of the thermoelectric conversion element module 2, the metal foil 7 is etched.

The heat absorption side heat exchange body 3 and the resin 6 are also fusion bonded. But, where the metal foil is not disposed on the heat radiation side, the resin 6 is simply fusion bonded to the heat absorption side heat exchange body 3.

According to the first embodiment, the insulating layer (resin) is disposed between the heat exchange body and the electrodes of the thermoelectric conversion element module. The resin becomes soft when heated and then cures to fill the cavities and flaws formed in the surface of the heat exchange body. Therefore, insulation between the electrodes of the thermoelectric conversion element module and the heat exchange body can be secured regardless of the presence or not of the cavities and flaws in the surface of the heat exchange body. Therefore, the yield when the heat exchanger is manufactured can be improved.

It is not necessary to interpose a material having high thermal resistance such as grease at least between the heat radiation side heat exchange body and the thermoelectric conversion element module or between the heat absorption side heat exchange body and the thermoelectric conversion element module, so that the thermal resistance can be reduced. Therefore, the efficiency of the heat exchanger can be improved, great heat quantity can be exchanged by small power, and the temperature can be controlled accurately.

EMBODIMENT 2

Figure 4:
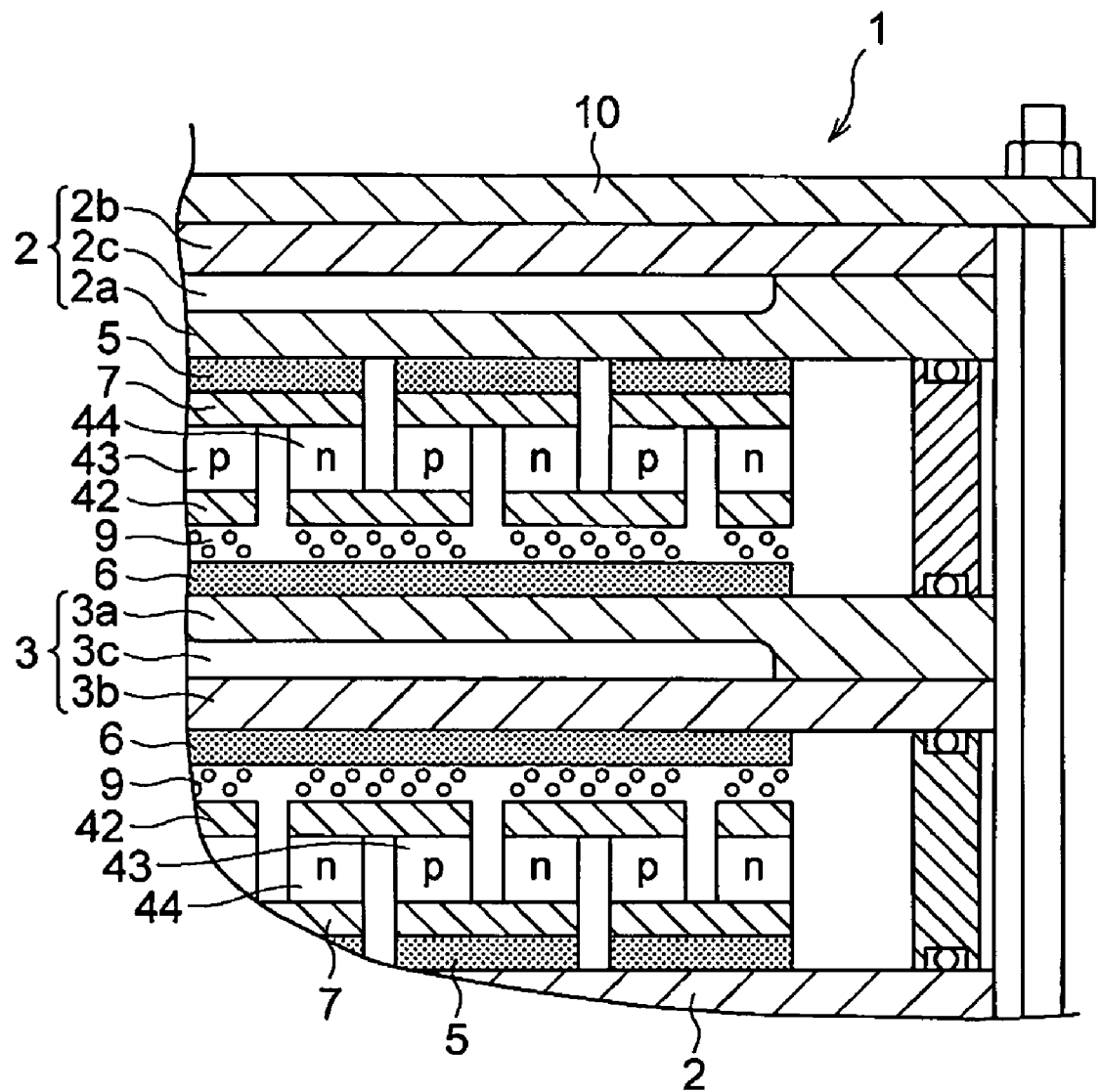
FIG. 4 is a diagram showing a structure of the heat exchanger 1 according to a second embodiment.
Figure 5:
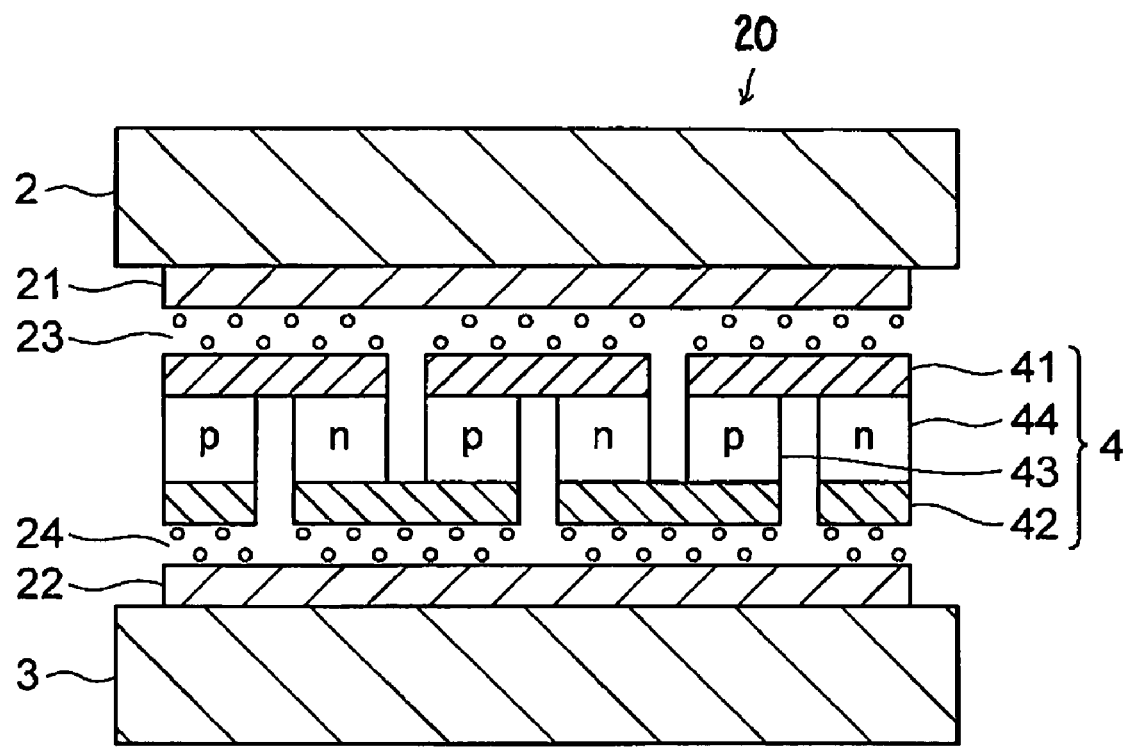
FIG. 5 is a diagram showing a structure of a basic heat exchanger.
Figure 6:
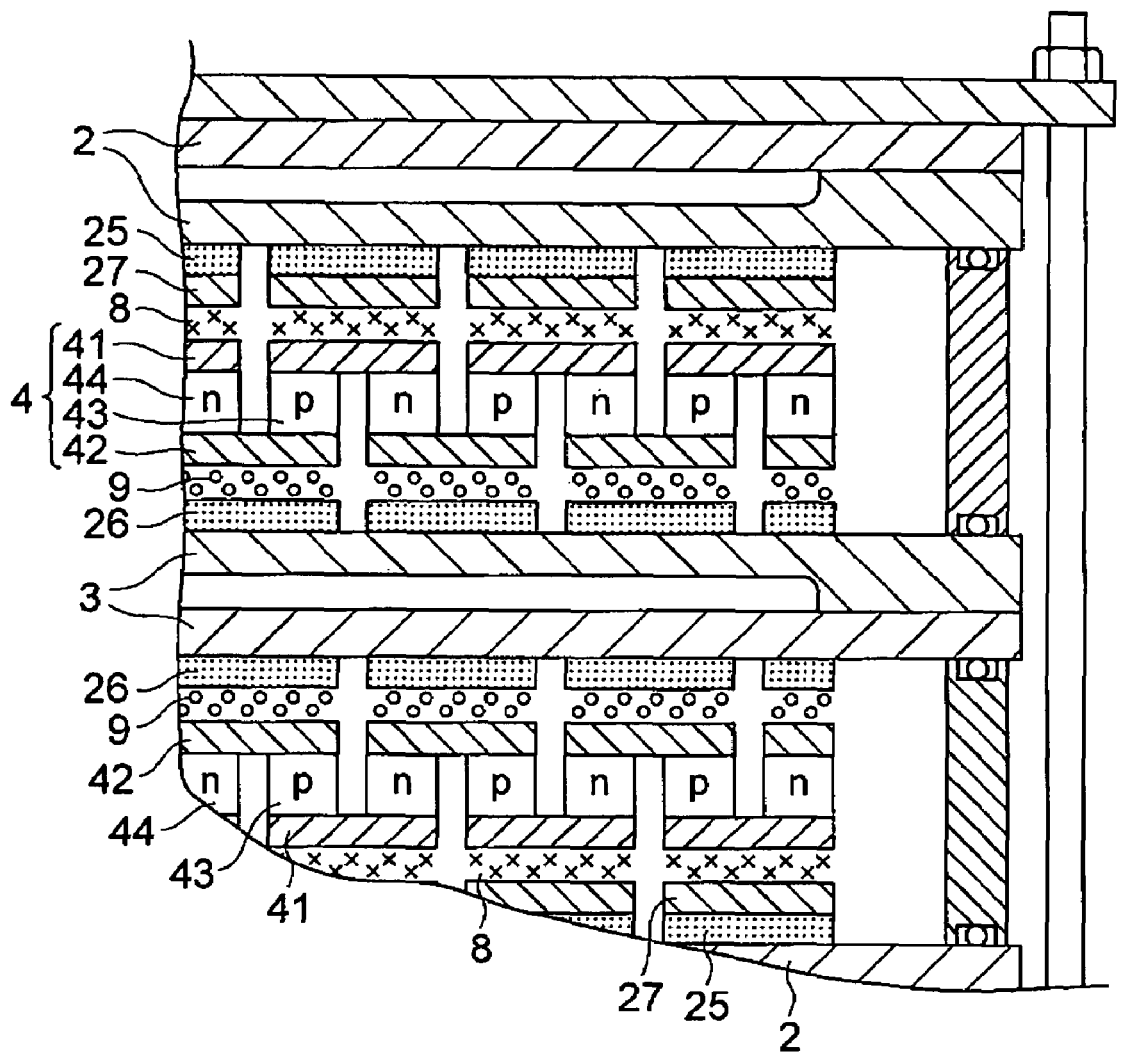
FIG. 6 is a diagram showing a structure of a conventional heat exchanger.

FIG. 4 is a diagram showing a structure of the heat exchanger 1 according to the second embodiment, illustrating in detail the portion R of FIG. 1.

The heat absorption side has the same structure between the first embodiment and the second embodiment, but the heat radiation side has a slightly different structure. The resin 5 has its one side fusion bonded to the heat radiation side heat exchange body 2 and the other side fusion bonded to the metal foil 7 having a thickness greater than that of the first embodiment. The metal foil 7 also serves as the heat radiation side electrodes of the thermoelectric conversion element module, and the p-type and n-type thermoelectric conversion elements 43, 44 are connected to both ends of the metal foil 7 by soldering. The resin 6 has its one side fusion bonded to the heat absorption side heat exchange body 3 and the other side contacted to the grease 9. The grease 9 is in contact with the heat absorption side electrodes 42 of the thermoelectric conversion element module.

According to this embodiment, the same effect as in the first embodiment is obtained. And, members interposed between the heat radiation side heat exchange body and the heat radiation side electrodes of the thermoelectric conversion element module are decreased, so that the thermal resistance is further decreased.

In the first and second embodiments, the heat radiation side heat exchange body 2 may be provided with a heat radiation fin instead of the cooling water flow passage 2c. And, cooling and heating can be switched between them by changing the direction of a current flowing through the thermoelectric conversion element module 4.

The heat absorption side heat exchange body may be determined as a placement plate on which a semiconductor wafer is placed and used as a temperature regulating plate for cooling or heating the semiconductor wafer. The temperature regulating plate has the heat radiation side heat exchange body disposed substantially parallel to and below the placement plate and the thermoelectric conversion element module interposed between the placement plate and the heat radiation side heat exchange body. A semiconductor wafer is placed on the upper surface of the placement plate through a positioning pin or pins. And, the thermoelectric conversion element module executes heat exchange to control the temperature of the semiconductor wafer. In the temperature regulating plate, the resin and the metal foil are formed on the surfaces of the heat radiation side heat exchange body and the placement plate as described in the first and second embodiments. And, the metal foil on the heat radiation side heat exchange body side and the heat radiation side electrode of the thermoelectric conversion element module are fixed by soldering or the like, and the metal foil on the placement plate side and the heat absorption side electrodes of the thermoelectric conversion element module are brought into close mutual contact through heat conductive grease. Thus, there can be obtained a placement plate having low thermal resistance on the contact surface and high heat transfer efficiency.

What is claimed is:

1. A heat exchanger comprising:
    a heat radiation side heat exchange body and a heat absorption side heat exchange body;
    a thermoelectric conversion element module interposed between the heat radiation side heat exchange body and the heat absorption side heat exchange body, the thermoelectric conversion element module being respectively configured of a plurality of heat radiation side electrodes, a plurality of thermoelectric conversion elements, and a plurality of heat absorption side electrodes;
    a heat radiation side insulating layer which is interposed between the heat radiation side electrodes of the thermoelectric conversion element module and the heat radiation side heat exchange body; and
    a heat absorption side insulating layer which is interposed between the heat absorption side electrodes of the thermoelectric conversion element module and the heat absorption side heat exchange body,
    wherein at least one of the heat radiation side insulating layer and the heat absorption side insulating layer is a resin which is fusion bonded to the adjacent heat exchange body by heating and pressing such that the melted resin enters cavities and flaws in a surface of the heat exchange body.

2. The heat exchanger according to claim 1, wherein a metal foil is interposed between the electrodes of the thermoelectric conversion element module and the resin.

3. The heat exchanger according to claim 1, wherein grease is interposed between the heat absorption side electrodes of the thermoelectric conversion element module and the heat absorption side insulating layer.

4. A method of manufacturing a heat exchanger having a thermoelectric conversion element module disposed between two heat exchange bodies, the method comprising:
    contacting one of the heat exchange bodies and a resin sheet; and
    heating and pressing the heat exchange body and the resin sheet such that the melted resin sheet enters cavities and flaws in a surface of the heat exchange body to form an insulating layer for insulating the heat exchange body and the thermoelectric conversion element module.

* * * * *